United States Patent
Cho

(10) Patent No.: US 9,723,712 B2
(45) Date of Patent: Aug. 1, 2017

(54) CURVED DISPLAY DEVICE

(71) Applicant: Samsung Display Co. Ltd., Yongin, Gyeonggi-Do (KR)

(72) Inventor: Dong Beom Cho, Asan-si (KR)

(73) Assignee: Samsung Display Co., Ltd. (KR)

( * ) Notice: Subject to any disclaimer, the term of this patent is extended or adjusted under 35 U.S.C. 154(b) by 153 days.

(21) Appl. No.: 14/559,837

(22) Filed: Dec. 3, 2014

(65) Prior Publication Data

US 2016/0066410 A1    Mar. 3, 2016

(30) Foreign Application Priority Data

Sep. 2, 2014  (KR) .................. 10-2014-0116234

(51) Int. Cl.
| | |
|---|---|
| H05K 1/02 | (2006.01) |
| H05K 1/11 | (2006.01) |
| H05K 3/36 | (2006.01) |
| H05K 1/14 | (2006.01) |
| H05K 1/18 | (2006.01) |

(52) U.S. Cl.
CPC ............. *H05K 1/028* (2013.01); *H05K 1/111* (2013.01); *H05K 3/361* (2013.01); *H05K 1/147* (2013.01); *H05K 1/189* (2013.01); *H05K 2201/09418* (2013.01); *H05K 2201/09427* (2013.01); *H05K 2201/09445* (2013.01); *H05K 2201/10136* (2013.01); *Y02P 70/611* (2015.11)

(58) Field of Classification Search
CPC ........ H05K 1/028; H05K 1/111; H05K 3/361; H05K 1/189
See application file for complete search history.

(56) References Cited

U.S. PATENT DOCUMENTS

| | | | | |
|---|---|---|---|---|
| 5,951,304 A | * | 9/1999 | Wildes | .................. B81B 7/0006 174/261 |
| 6,710,838 B2 | * | 3/2004 | Sakaki | ................ G02F 1/13452 345/102 |
| 6,784,373 B2 | * | 8/2004 | Kusaka | .................. H05K 1/028 174/255 |
| 6,909,488 B2 | * | 6/2005 | Kurasawa | ........... G02F 1/13452 349/150 |
| 6,959,210 B2 | * | 10/2005 | Nakamura | ............. H01Q 1/084 336/200 |

(Continued)

FOREIGN PATENT DOCUMENTS

| | | | |
|---|---|---|---|
| CN | 202979461 U | * | 6/2013 |
| JP | 07325315 A | * | 12/1995 |

(Continued)

*Primary Examiner* — Jeremy C Norris
*Assistant Examiner* — Nathan Milakovich
(74) *Attorney, Agent, or Firm* — Innovation Counsel LLP

(57) ABSTRACT

A curved display device is provided. The curved display device includes: a curved display panel configured to have short sides and long sides; a printed circuit board (PCB) configured to provide signals for driving the curved display panel; and a flexible wiring board including a first portion, which is connected to a first area, a second portion, which is connected to the PCB, and a third portion, which is disposed between the first portion and the second portion and has curved sides, wherein a curvature radius of a first side of the curved sides differs from a curvature radius of a second side of the curved sides.

12 Claims, 7 Drawing Sheets

(56) References Cited

U.S. PATENT DOCUMENTS

| | | | | |
|---|---|---|---|---|
| 6,990,355 B2* | 1/2006 | Ueyama | ............... | H04M 1/0216 361/749 |
| 7,211,736 B2* | 5/2007 | Lassar | ................... | H05K 1/111 174/254 |
| 7,419,380 B2* | 9/2008 | Yamada | ............... | H05K 1/0269 349/149 |
| D601,520 S * | 10/2009 | Yokota | ......................... | D13/182 |
| 7,746,439 B2* | 6/2010 | Kohno | ............... | G02F 1/13452 349/150 |
| 9,210,804 B2* | 12/2015 | Ooishi | ..................... | G09F 13/04 |
| 2005/0018409 A1* | 1/2005 | Hirakata | ................ | H05K 1/028 361/752 |
| 2007/0182911 A1* | 8/2007 | Cha | ....................... | G02F 1/1345 349/150 |
| 2011/0132643 A1* | 6/2011 | Hattori | ..................... | C22F 1/08 174/254 |
| 2012/0249883 A1* | 10/2012 | Happoya | ................. | H04N 5/64 348/725 |
| 2013/0148315 A1* | 6/2013 | Dabov | ................ | G06F 1/1613 361/749 |
| 2013/0207946 A1* | 8/2013 | Kim | ..................... | G09G 3/3225 345/204 |
| 2013/0321740 A1* | 12/2013 | An | ...................... | H05K 5/0217 349/58 |
| 2014/0306985 A1* | 10/2014 | Jeong | ................... | G09G 3/3233 345/601 |
| 2014/0320779 A1* | 10/2014 | Noumi | ................ | G02F 1/13452 349/58 |
| 2014/0321088 A1* | 10/2014 | Bae | ....................... | H05K 1/117 361/767 |
| 2014/0354900 A1* | 12/2014 | Qian | ..................... | G06F 1/1658 349/12 |
| 2015/0103500 A1* | 4/2015 | Bae | ......................... | H01L 24/06 361/749 |
| 2015/0173171 A1* | 6/2015 | Kim | ....................... | H05K 1/028 361/749 |
| 2015/0189768 A1* | 7/2015 | Kishida | ................. | H05K 1/0283 361/749 |
| 2015/0208522 A1* | 7/2015 | Kim | ....................... | H05K 1/028 361/749 |
| 2015/0245488 A1* | 8/2015 | Jang | ........................ | G06F 1/16 361/749 |
| 2015/0316810 A1* | 11/2015 | Shibahara | ............ | G02F 1/1333 349/150 |
| 2015/0362788 A1* | 12/2015 | Park | ................. | G02F 1/133308 349/58 |
| 2016/0070376 A1* | 3/2016 | Lee | ......................... | G06F 3/041 345/173 |
| 2016/0088726 A1* | 3/2016 | Jeon | ..................... | H05K 1/028 361/749 |
| 2016/0165726 A1* | 6/2016 | Lee | ....................... | H05K 1/142 361/749 |
| 2016/0219706 A1* | 7/2016 | Jo | ......................... | H05K 1/118 |

FOREIGN PATENT DOCUMENTS

| | | | | |
|---|---|---|---|---|
| JP | 2000187452 A | * | 7/2000 | |
| JP | WO 2014147684 A1 | * | 9/2014 | ......... G02F 1/13452 |
| KR | 10-2010-0039018 | | 4/2010 | |
| KR | 10-2012-0014319 | | 2/2012 | |
| KR | 10-2012-0052764 | | 5/2012 | |
| KR | DE 202013100638 U1 | * | 3/2013 | ............ G02F 1/1333 |
| WO | JP 2001109391 A | * | 4/2001 | |

* cited by examiner

CURVED DISPLAY DEVICE

This application claims priority to Korean Patent Application No. 10-2014-0116234 filed on Sep. 2, 2014 in the Korean Intellectual Property Office, the disclosure of which is incorporated herein by reference in its entirety.

BACKGROUND

1. Field

The inventive concept relates to a curved display device.

2. Description of the Related Art

The market for flat panel displays (FPDs) such as a liquid crystal display (LCD) or an organic light-emitting display has rapidly expanded, and various developments have been made on FPDs. The development of FPDs has opened the way for the fabrication of thin, light-weighted display devices, and has enabled a variety of display devices of different sizes and shapes.

An FPD includes a display panel, which displays an image, one or more printed circuit boards (PCBs) and one or more flexible wiring boards. The display panel includes a substrate, devices disposed on the substrate, and wiring transmitting scan signals, image signals and power to the devices on the substrate. The PCB supplies the scan signals, the image signals and the power. The flexible wiring board connects the display panel and the PCB together.

The flexible wiring boards may be connected to the display panel at one side thereof, and may be connected the PCBs at the other side thereof. In a case in which the PCBs are provided on the rear of the display panel, the flexible wiring boards may be bent.

Recently, curved display devices, which are curved FPDs, have been developed. In a curved display device, however, the stress applied to the flexible wiring boards may increase due to a curvature of the curved display panel, and as a result, the bonding strength between the flexible wiring boards and the display panel or between the flexible wiring boards and the PCBs may weaken.

SUMMARY

Exemplary embodiments of the inventive concept provide a curved display device capable of reducing the stress applied to each flexible wiring board and improving reliability.

However, exemplary embodiments of the inventive concept are not restricted to those set forth herein. The above and other exemplary embodiments of the inventive concept will become more apparent to one of ordinary skill in the art to which the inventive concept pertains by referencing the detailed description of the inventive concept given below.

According to an exemplary embodiment of the inventive concept, there is a provided a curved display device. The curved display device includes: a curved display panel configured to have short sides and long sides; a printed circuit board (PCB) configured to provide signals for driving the curved display panel; and a flexible wiring board including a first portion, which is connected to a first area, a second portion, which is connected to the PCB, and a third portion, which is disposed between the first portion and the second portion and has curved sides, wherein a curvature radius of a first side of the curved sides differs from a curvature radius of a second side of the curved sides.

According to another exemplary embodiment of the inventive concept, there is a provided a curved display device. The curved display device includes: a curved display panel configured to have short sides and long sides with curvature, the curved display panel including a first area, which includes a central line dividing the long sides of the curved display panel in half and has a first curvature radius, and a second area which has a second curvature radius that is greater than the first curvature radius; a first flexible wiring board configured to be connected to the first area of the curved display panel; a second flexible wiring board configured to be connected to the second area of the curved display panel; a first PCB configured to be connected to the first flexible wiring board and provide signals for driving the curved display panel; and a second PCB configured to be connected to the second flexible wiring board and provide signals for driving the curved display panel, wherein the first flexible wiring board includes a first portion, which is connected to the first area, a second portion, which is connected to the first PCB, and a third portion, which is disposed between the first portion and the second portion and has curved sides, and the second flexible wiring board includes a fourth portion, which is connected to the second area, a fifth portion, which is connected to the second PCB, and a sixth portion, which is disposed between the fourth portion to and the fifth portion and has curved sides.

According to the exemplary embodiments, it is possible to provide a curved display device capable of reducing the stress applied to each flexible wiring board and improving reliability Other features and exemplary embodiments will be apparent from the following detailed description, the drawings, and the claims.

BRIEF DESCRIPTION OF THE DRAWINGS

The above and other features and advantages of the present inventive concept will become more apparent by detailed description of the embodiments thereof with reference to the attached drawings in which.

DETAILED DESCRIPTION OF THE EMBODIMENTS

Figure 1:
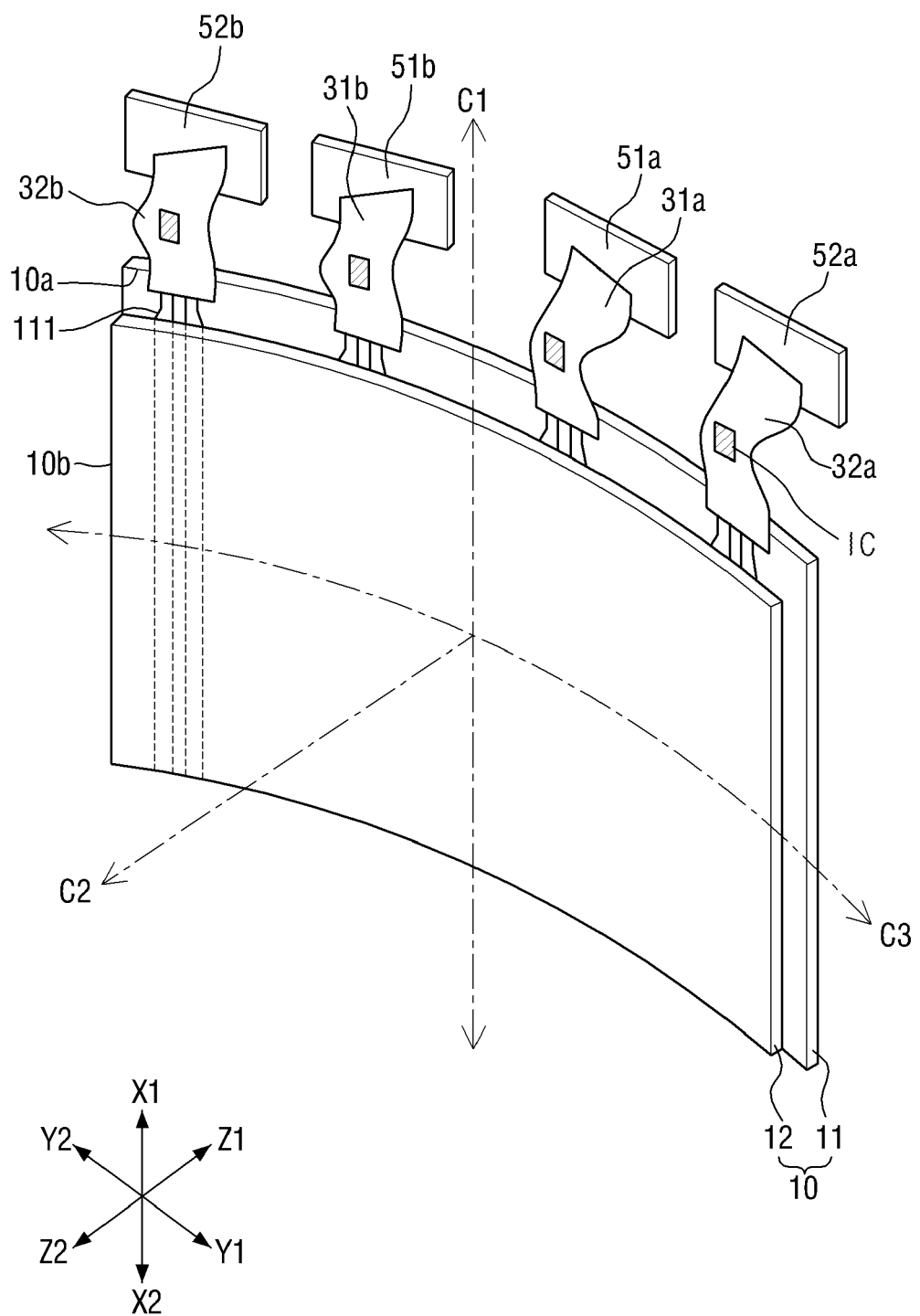
FIG. 1 is a schematic diagram of a curved display device according to an exemplary embodiment of the inventive concept.

Advantages and features of the present inventive concept and methods of accomplishing the same may be understood more readily by reference to the following detailed description of embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the inventive concept to those skilled in the art, and the present inventive concept will only be defined by the appended claims. Like reference numerals refer to like elements throughout the specification.

The terminology used herein is for the purpose of describing particular embodiments only and is not intended to limit the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected to or coupled to the other element or layer or intervening elements or layers may be present between the element or layer and the another element or layer. In contrast, when an element is referred to as being "directly on", "directly connected to" or "directly coupled to" another element or layer, there are no intervening elements or layers present between the element or layer and the another element or layer. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to is another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Exemplary embodiments will hereinafter be described with reference to the accompanying drawings.

Figure 2:
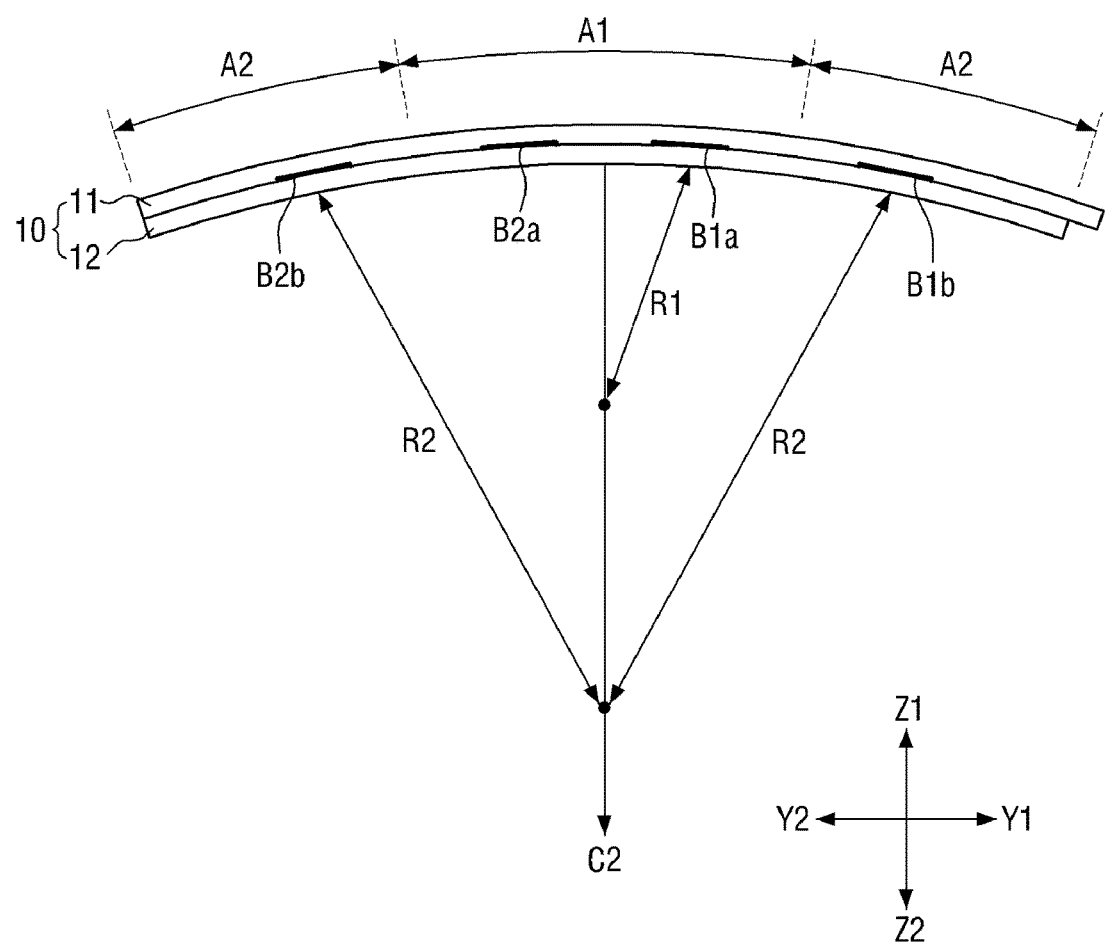
FIG. 2 is a top view of a curved display panel illustrated in FIG. 1.
Figure 3:
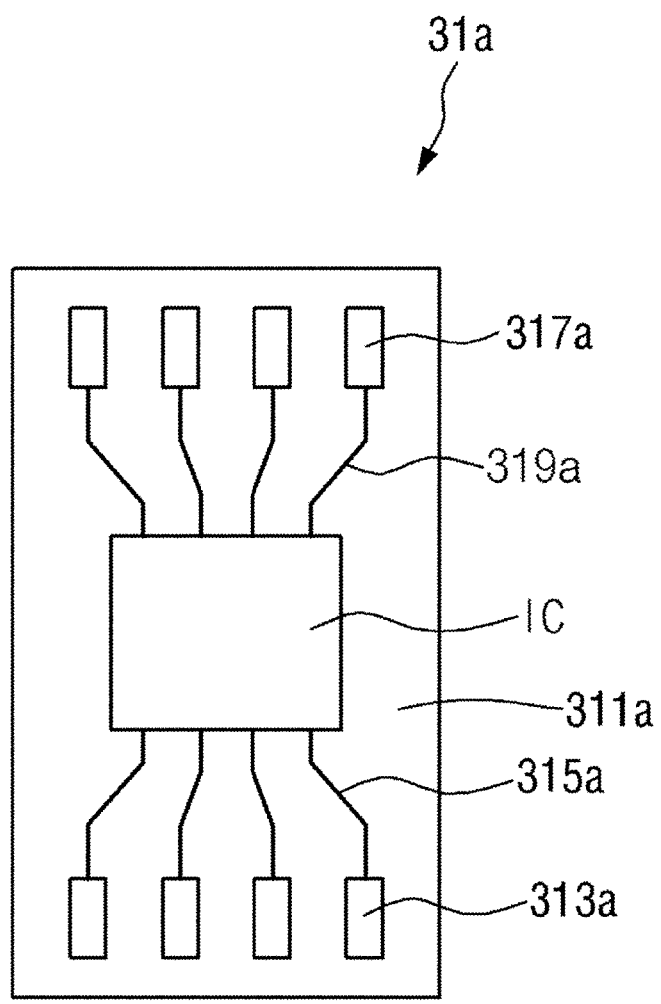
FIG. 3 is a plan view of a flexible wiring board illustrated in FIG. 1.

FIG. 1 is a schematic diagram of a curved display device according to an exemplary embodiment of the inventive concept, FIG. 2 is a top view of a curved display panel illustrated in FIG. 1, and FIG. 3 is a plan view of a flexible wiring board illustrated in FIG. 1.

Referring to FIGS. 1 to 3, a curved display device according to an exemplary embodiment of the inventive concept includes a curved display panel 10, which has long sides 10a and short sides 10b, a plurality of flexible wiring boards 31a, 31b, 32a and 32b, and a plurality of printed circuit boards (PCBs) 51a, 51b, 52a and 52b, which are connected to the flexible wiring boards 31a, 31b, 32a and 32b, respectively.

The curved display panel 10 may be a liquid crystal display (LCD) panel or an organic light-emitting display panel.

In a case in which the curved display panel 10 is an LCD panel, the curved display panel 10 may include a first substrate 11, a second substrate 12 and a liquid crystal layer (not illustrated) interposed between the first substrate 11 and the second substrate 12.

In a case in which the curved display panel 10 is an LCD panel, a plurality of data lines 111 and a plurality of gate lines (not illustrated) may be provided on the first substrate 11 to intersect each other, and may thus define a plurality of pixel regions. In each of the pixel regions, a thin-film transistor (TFT) and a pixel electrode connected to the TFT may be provided. The second substrate 12 may be a color filter substrate, and may include a plurality of red, green and blue color filters corresponding to a plurality of pixels, respectively, and a common electrode covering the plurality of red, green and blue color filters.

In a case in which the curved display panel 10 is an organic light-emitting display panel, the curved display panel 10 may include a first substrate 11, which has a plurality of pixels and a cathode electrode layer, and a second substrate 12, which is bonded to the first substrate 11 to face the first substrate 11.

In a case in which the curved display panel 10 is an organic light-emitting display panel, the plurality of pixels may be disposed in a plurality of pixel regions, respectively, which are defined by a plurality of data lines 111 and a plurality of gate lines (not illustrated) that are provided on the first substrate 11 to intersect each other to define a plurality of pixel regions. Each of the plurality of pixels may include a pixel circuit and a light-emitting cell. The pixel circuit may supply a data current corresponding to a data signal that is applied thereto via a data line 111 to the light-emitting cell in response to the receipt of a gate signal applied thereto via a gate line (not illustrated). For example, the pixel circuit may include a switching TFT, a driving TFT and a capacitor. The switching TFT may be switched on or off in response to a gate signal applied thereto via a gate line (not illustrated) and may thus supply a data voltage supplied thereto via a data line 111 to the driving TFT. The driving TFT may be switched on or off by the data voltage supplied by the switching TFT, and may thus generate a data current corresponding to the data voltage and apply the data current to the light-emitting cell. The capacitor may sustain the data voltage supplied to the driving TFT for a single-frame period.

The light-emitting cell may include an anode electrode connected to the driving circuit and an organic layer formed between the anode electrode and the cathode electrode layer. The organic layer may have a laminated structure of a hole transport layer, an organic light-emitting layer, and an electron transport layer or a laminated structure of a hole injection layer, a hole transport layer, an organic light-emitting layer, an electron transport layer and an electron injection layer. The organic layer may also have a functional layer for improving the emission efficiency and/or the lifetime of the organic light-emitting layer.

The cathode electrode layer may be formed to cover the entire region on the first substrate 11, except for the edges of the first substrate 11, and may be connected to the light-emitting cell of each of the plurality of pixels.

In a case in which the curved display panel 10 is an organic light-emitting display panel, the second substrate 12 may be formed of glass or a metallic material in the form of a flat panel, and may be bonded to the first substrate 11 to face the first substrate 11. Accordingly, the second substrate 12 may protect the light-emitting cell of each of the plurality of pixels on the first substrate 11 from moisture or oxygen. The second substrate 12 may be attached onto a non-display region of the first substrate 11 by a sealing member, which is formed to surround a display region of the first substrate 11.

In an exemplary embodiment, the first substrate 11 may have a relatively larger area than the second substrate 12, and may have a region (hereinafter, the peripheral region) where the first substrate 11 protrudes beyond the second substrate 12. In the peripheral region of the first substrate 11, one or more panel connection pads (not illustrated), which are connected to the data lines 111, may be provided. The flexible wiring boards 31a, 31b, 32a and 32b may be connected to the panel connection pads.

The curved display panel 10 may include the long sides 10a and the short sides 10b, and the long sides 10a and the short sides 10b may both have curvature. For convenience, a line that divides the long sides 10a in half is defined as a central line C1, a line that is perpendicular to the central line and forms a curved surface of the curved display panel 10 is defined as a tangential directional line C3, and a line that is perpendicular to both the central line C1 and the tangential directional line C3 is defined as a normal line C2.

As illustrated in FIG. 2, the curved display panel 10 may include a first area A1 having a first curvature radius R1 and a second area A2 having a second curvature radius R2, which is different from the first curvature radius R1. The center of the first curvature radius R1 and the center of the second curvature radius R2 may fall on the same side of the curved display panel 10 (i.e., on the side of a Z2 direction), and particularly, on the normal line C2.

Arcs of circles described by the first curvature radius R1 and the second curvature radius R2 may become a display surface. An image may be displayed on the display surface.

The curved display panel 10 is illustrated in FIG. 2 as having the first area A1 and the second area A2 only, but the inventive concept is not limited thereto. That is, the curved display panel 10 may also include a third area having an arbitrary third curvature radius. The first area A1 and the second area A2 are illustrated in FIG. 2 as being continuous from each other, but the inventive concept is not limited thereto. That is, the first area A1 and the second area A2 may not necessarily be continuous from each other.

Parts B1a and B2a to which the flexible wiring boards 31a and 31b are connected may be located in the first area A1, and parts B1b and B2b to which the flexible wiring boards 32a and 32b are connected may be located in the second area A2.

The first curvature radius R1 of the first area A1 may be smaller than the second radius curvature R2 of the second area A2, as illustrated in FIG. 2, that is, the first area A1 may be more curved than the second area A2. Alternatively, the first curvature radius R1 may be greater than the second curvature radius R2, i.e., the first area A1 may be less curved than the second area A2. In the description that follows, it is assumed that the first curvature radius R1 is less than the second curvature radius R2, but the inventive concept is not limited thereto.

As illustrated in FIG. 1, the PCBs 51a, 51b, 52a and 52b may provide signals for driving the curved display panel 10, and various elements such as a timing controller, a power source unit, and a gamma voltage generation unit that primarily process various signal data input thereto from an external device such as a computer and generate signal voltages for displaying an image may be mounted on the PCBs 51a, 51b, 52a and 52b. For this reason, connectors, a plurality of resistors and a plurality of capacitors may be mounted on the PCBs 51a, 51b, 52a and 52b to receive and transmit signal data. Multiple PCBs may be provided, as illustrated in FIG. 1, but the inventive concept is not limited thereto. That is, one PCB may be connected to a plurality of flexible wiring boards 31a, 31b, 32a and 32b. In the description that follows, it is assumed that a plurality of PCBs, i.e., the PCBs 51a, 51b, 52a and 52b, are provided.

The flexible wiring boards 31a, 31b, 32a and 32b may be connected to the peripheral region of the first substrate 11. More specifically, the flexible wiring boards 31a, 31b, 32a and 32b may be connected to the panel connection pads in the peripheral region. The flexible wiring boards 31a, 31b, 32a and 32b may also be connected to the PCBs 51a, 51b, 52a and 52b, respectively. The flexible wiring boards 31a, 31b, 32a and 32b may be connected to the peripheral region of the first substrate 11 and the PCBs 51a, 51b, 52a and 52b, respectively, via tape automated bonding (TAB), but the inventive concept is not limited thereto.

In an exemplary embodiment, a driving chip IC may be mounted on each of the flexible wiring boards 31a, 31b, 32a and 32b. More specifically, referring to FIG. 3, an arbitrary flexible wiring board, for example, the flexible wiring board 31a, may include a base film 311a, a driving chip IC mounted on the base film 311a, a plurality of input wires 315a connected to the driving chip IC, a plurality of input pads 313a connected to the input wires 315a, respectively, a plurality of output wires 319a connected to the driving chip IC, and a plurality of output pads 317a connected to the output wires 319a, respectively.

The base film 311a may be formed of an insulating material with flexibility. In an exemplary embodiment, the insulating material may be polyimide (PI), but the inventive concept is not limited thereto. That is, the base film 311a may be formed of acrylic, poly-ether-nitrile, polyethersulfone (PES), polyethylene terephthalate (PET), polyethylene naphthalate (PEN) or polyvinyl chloride (PVC).

The input wires 315a and the output wires 319a may be formed of an electrically conductive material. In an exemplary embodiment, the input wires 315a and the output wires 319a may be formed of copper (Cu), nickel (Ni), gold (Au), solder or an alloy thereof, but the inventive concept is not limited thereto.

Similarly, the input pads 313a and the output pads 317a, which are connected to the PCB and the curved display panel 10, respectively, may be formed of an electrically conductive material.

The driving chip IC may be mounted on the base film 311a. In an exemplary embodiment, the driving chip IC may be a data driver IC.

The flexible wiring board 31a may be a substantially rectangular in a plan view, but the inventive concept is not limited thereto. That is, the flexible wiring board 31a may be formed in various shapes other than a rectangular shape, such as rectangular or trapezoidal shape having curved side surface.

The description of the flexible wiring board 31a is directly applicable to the flexible wiring boards 31b, 32a and 32b, and thus, detailed descriptions of the flexible wiring boards 31b, 32a and 32b will be omitted.

Referring back to FIGS. 1 and 2, some of the flexible wiring boards 31a, 31b, 32a and 32b, i.e., the flexible wiring boards 31a and 31b, may be connected to the first area A1, and the other flexible wiring boards, i.e., the flexible wiring boards 32a and 32b, may be connected to the second area A2. For convenience, the flexible wiring board disposed on the right side of the central line C1 and connected to the first area A1 and the flexible wiring board disposed on the right side of the central line C1 and connected to the second area A2 will hereinafter be referred to as a first flexible wiring board 31a and a second flexible wiring board 32a, respectively, and the PCB connected to the first flexible wiring board 31a and the PCB connected to the second flexible wiring board 32a will hereinafter be referred to as a first PCB 51a and a second PCB 52a, respectively. Since the flexible wiring board disposed on the left side of the central line C1 and connected to the first area A1, i.e., the flexible wiring board 31b, and the flexible wiring board disposed on the left side of the central line C1 and connected to the second area A2, i.e., the flexible wiring board 32b, are substantially identical to the first flexible wiring board 31a and the second flexible wiring board 32a, respectively, thus, detailed descriptions of the flexible wiring boards 31b and 32b will be omitted.

Figure 4:
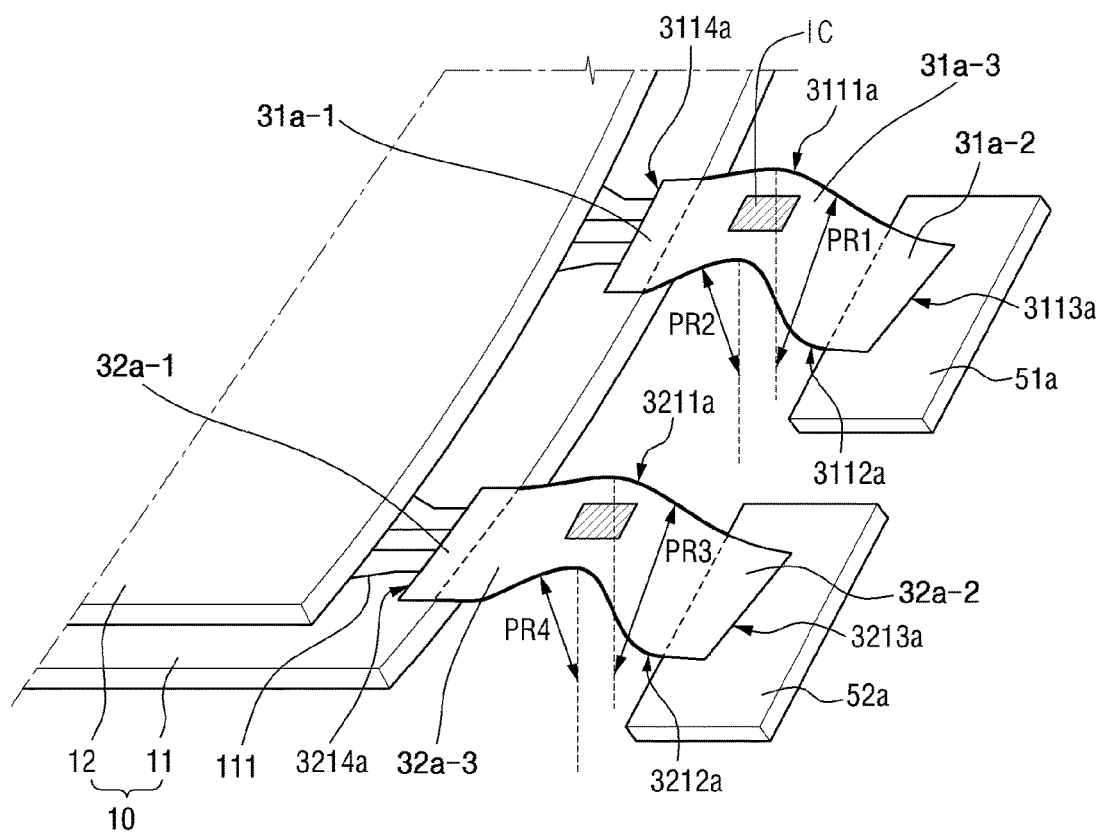
FIG. 4 is an enlarged view of part of the curved display device of FIG. 1.
Figure 4:
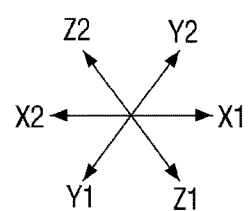

FIG. 4 is an enlarged view of part of the curved display device of FIG. 1, and particularly, part of the curved display device where the first flexible wiring board 31a and the second flexible wiring board 32a are located.

Referring to FIGS. 1, 2 and 4, the first flexible wiring board 31a may be attached onto the first area A1 of the curved display panel 10 and the first PCB 51a. That is, a first end portion 3114a of the first flexible wiring board 31a may be disposed on the first area A1 of the curved display panel 10, and a second end portion 3113a of the first flexible wiring board 31a may be disposed on the first PCB 51a. Similarly, the second flexible wiring board 32a may be attached onto the second area A2 of the curved display panel 10 and the second PCB 52a. That is, a first end portion 3214a of the second flexible wiring board 32a may be disposed on the second area A2 of the curved display panel 10, and a second end portion 3213a of the second flexible wiring board 32a may be disposed on the second PCB 52a.

The first flexible wiring board 31a may include a first portion 31a-1, which is attached onto the first area A1 of the curved display panel 10, a second portion 31a-2, which is attached onto the first PCB 51a, and a third portion 31a-3, which is disposed between the a first portion 31a-1 and the second portion 31a-2 and connects the a first portion 31a-1 and the second portion 31a-2.

The third portion 31a-3, which is a part of the first flexible wiring board 31a attached to neither the curved display panel 10 nor the first PCB 51a, may have a curved shape. That is, the third portion 31a-3 may have a predetermined curvature.

A first side 3111a of the third portion 31a-3 may be closer than a second side 3112a of the third portion 31a-3 to the central line C1.

A curvature radius PR1 of the first side 3111a of the third portion 31a-3 may differ from a curvature radius PR2 of the second side 3112a of the third portion 31a-3. In an exemplary embodiment, the first flexible wiring board 31a may be twisted to be attached onto the curved display panel 10 and the first PCB 51a, and as a result, the curvature radius PR1 of the first side 3111a of the third portion 31a-3 may become different from the curvature radius PR2 of the second side 3112a of the third portion 31a-3.

In an exemplary embodiment, in a case in which the first curvature radius R1 of the first area A1 of the curved display panel 10 is smaller than the second curvature radius R2 of the second area A2 of the curved display panel 10 or in a case in which the curvature radius at the central line C1 is smaller than the curvature radius at either side of the curved display panel 10, the curvature radius PR1 of the first side 3111a of the third portion 31a-3 which is close to the central line C1, may be greater than the curvature radius PR2 of the second side 3112a of the third portion 31a-3.

In a case in which the curvature radius PR1 of the first side 3111a of the third portion 31a-3 is the same as the curvature radius PR2 of the second side 3112a of the third portion 31a-3, stress such as shear stress may be applied to the first flexible wiring board 31a due to the curvature of the curved display panel 10. In a case in which the first PCB 51a is disposed on the rear side of the curved display panel 10 or below the first substrate 11, the stress applied to the first flexible wiring board 31a may increase because the first flexible wiring board 31a may be bent. As a result, the first flexible wiring board 31a may be damaged, or may be detached from the curved display panel 10 or the first PCB 51a.

On the other hand, in an exemplary embodiment, by forming the first flexible wiring board 31a such that the curvature radius PR1 of the first side 3111a of the third portion 31a-3 may be greater than the curvature radius PR2 of the second side 3112a of the third portion 31a-3, the stress applied to the first flexible wiring board 31a may be lowered even if the first PCB 51a is provided on the rear side of the curved display panel 10 or below the first substrate 11, and as a result, the first flexible wiring board 31a may be prevented from being detached from the curved display panel 10 or the first PCB 51a.

The length of the first side 3111a of the third portion 31a-3 may differ from the length of the second side 3112a of the third portion 31a-3. In an exemplary embodiment, the first side 3111a of the third portion 31a-3 may be shorter than the second side 3112a of the third portion 31a-3. More specifically, in a case in which the first flexible wiring board 31a is formed to have a rectangular shape, the first side 3111a of the third portion 31a-3 may be formed to be shorter than the second side 3112a of the third portion 31a-3 in order for the curvature radius PR1 of the first side 3111*a* of the third portion 31*a*-3 to be greater than the curvature radius PR2 of the second side 3112*a* of the third portion 31*a*-3.

Alternatively, in a case in which the first curvature radius R1 of the first area A1 of the curved display panel 10 is greater than the second curvature radius R2 of the second area A2 of the curved display panel 10, the curvature radius PR1 of the first side 3111*a* of the third portion 31*a*-3 may be smaller than the curvature radius PR2 of the second side 3112*a* of the third portion 31*a*-3, and the first side 3111*a* of the third portion 31*a*-3 may be longer than the second side 3112*a* of the third portion 31*a*-3.

Similarly, the second flexible wiring board 32*a* may include a fourth portion 32*a*-1, which is attached onto the second area A2 of the curved display panel 10, a fifth portion 32*a*-2, which is attached onto the second PCB 52*a*, and a sixth portion 32*a*-3, which is disposed between the fourth portion 32*a*-1 and the fifth portion 32*a*-2 and connects the fourth portion 32*a*-1 and the fifth portion 32*a*-2.

The sixth portion 32*a*-3, which is part of the second flexible wiring board 32*a* attached to neither the curved display panel 10 nor the second PCB 52*a*, may have a curved shape. That is, the sixth portion 32*a*-3 may have a predetermined curvature.

A first side 3211*a* of the sixth portion 32*a*-3 may be closer than a second side 3212*a* of the sixth portion 32*a*-3 to the central line C1.

A curvature radius PR3 of the first side 3211*a* of the sixth portion 32*a*-3 may differ from a curvature radius PR4 of the second side 3212*a* of the sixth portion 32*a*-3. In an exemplary embodiment, the second flexible wiring board 32*a* may be twisted to be attached onto the curved display panel 10 and the second PCB 52*a*, and as a result, the curvature radius PR3 of the first side 3211*a* of the sixth portion 32*a*-3 may become different from the curvature radius PR4 of the second side 3212*a* of the sixth portion 32*a*-3.

In an exemplary embodiment, in a case in which the first curvature radius R1 of the first area A1 of the curved display panel 10 is smaller than the second curvature radius R2 of the second area A2 of the curved display panel 10 or in a case in which the curvature radius at the central line C1 is smaller than the curvature radius at either side of the curved display panel 10, the curvature radius PR3 of the first side 3211*a* of the sixth portion 32*a*-3 may be greater than the curvature radius PR4 of the second side 3212*a* of the sixth portion 32*a*-3.

By forming the second flexible wiring board 32*a* such that the curvature radius PR3 of the first side 3211*a* of sixth portion 32*a*-3 may be greater than the curvature radius PR4 of the second side 3212*a* of the sixth portion 32*a*-3, the stress applied to the second flexible wiring board 32*a* may be lowered even if the second PCB 52*a* is provided on the rear side of the curved display panel 10 or below the first substrate 11. As a result, the second flexible wiring board 32*a* may be prevented from being detached from the curved display panel 10 or the second PCB 52*a*.

The length of the first side 3211*a* of the sixth portion 32*a*-3 may differ from the length of the second side 3212*a* of the sixth portion 32*a*-3. In an exemplary embodiment, the first side 3211*a* of the sixth portion 32*a*-3 may be shorter than the second side 3212*a* of the sixth portion 32*a*-3. More specifically, in a case in which the second flexible wiring board 32*a* is formed to have a rectangular shape, the first side 3211*a* of the sixth portion 32*a*-3 may be formed to be shorter than the second side 3212*a* of the sixth portion 32*a*-3 in order for the curvature radius PR3 of the first side 3211*a* of the sixth portion 32*a*-3 to be greater than the curvature radius PR4 of the second side 3212*a* of the sixth portion 32*a*-3.

Alternatively, in a case in which the first curvature radius R1 of the first area A1 of the curved display panel 10 is greater than the second curvature radius R2 of the second area A2 of the curved display panel 10, the curvature radius PR3 of the first side 3211*a* of the sixth portion 32*a*-3 may be smaller than the curvature radius PR4 of the second side 3212*a* of the sixth portion 32*a*-3, and the first side 3211*a* of the sixth portion 32*a*-3 may be longer than the second side 3212*a* of the sixth portion 32*a*-3.

The first flexible wiring board 31*a* and the second flexible wiring board 32*a* will hereinafter be described in comparison to each other. The first flexible wiring board 31*a* is closer than the second flexible wiring board 32*a* to the central line C1. Accordingly, the first side 3111*a* of the third portion 31*a*-3 may be closer than the first side 3211*a* of the sixth portion 32*a*-3 to the central line C1, and the second side 3112*a* of the third portion 31*a*-3 may be closer than the second side 3212*a* of the sixth portion 32*a*-3 to the central line C1.

The curvature radius PR1 of the first side 3111*a* of the third portion 31*a*-3 may differ from the curvature radius PR3 of the first side 3211*a* of the sixth portion 32*a*-3.

In an exemplary embodiment, in a case in which the first curvature radius R1 of the first area A1 of the curved display panel 10 is smaller than the second curvature radius R2 of the second area A2 of the curved display panel 10 or in a case in which the curvature radius at the central line C1 is smaller than the curvature radius at either side of the curved display panel 10, the curvature radius PR1 of the first side 3111*a* of the third portion 31*a*-3 may be greater than the curvature radius PR3 of the first side 3211*a* of the sixth portion 32*a*-3. The length of the first side 3111*a* of the third portion 31*a*-3 may differ from the first side 3211*a* of the sixth portion 32*a*-3. In an exemplary embodiment, the first side 3111*a* of the third portion 31*a*-3 may be shorter than the first side 3211*a* of the sixth portion 32*a*-3.

The curvature radius PR2 of the second side 3211*a* of the third portion 31*a*-3 may differ from the curvature radius PR4 of the second side 3212*a* of the sixth portion 32*a*-3. In an exemplary embodiment, the curvature radius PR2 of the second side 3211*a* of the third portion 31*a*-3 may be greater than the curvature radius PR4 of the second side 3212*a* of the sixth portion 32*a*-3. The length of the second side 3211*a* of the third portion 31*a*-3 may differ from the length of the second side 3212*a* of the sixth portion 32*a*-3. In an exemplary embodiment, the second side 3211*a* of the third portion 31*a*-3 may be shorter than the second side 3212*a* of the sixth portion 32*a*-3.

As described above, the curvature of the curved display panel 10 may not necessarily be uniform throughout the entire curved display panel 10. Instead, the curved display panel 10 may include the first area A1 with the first curvature radius R1 and the second area A2 with the second curvature radius R2. In this case, the stress applied to each flexible wiring board of the curved display panel 10 may increase in a direction away from the central line C1. According to an exemplary embodiment, the sixth portion 32*a*-3, which is more distant than the third portion 31*a*-3 from the central line C1, may be formed to have a shorter curvature radius than the third portion 31*a*-3 or may be formed to be longer than the third portion 31*a*-3. Therefore, the stress applied to the second flexible wiring board 32*a* may be lowered.

Figure 5:
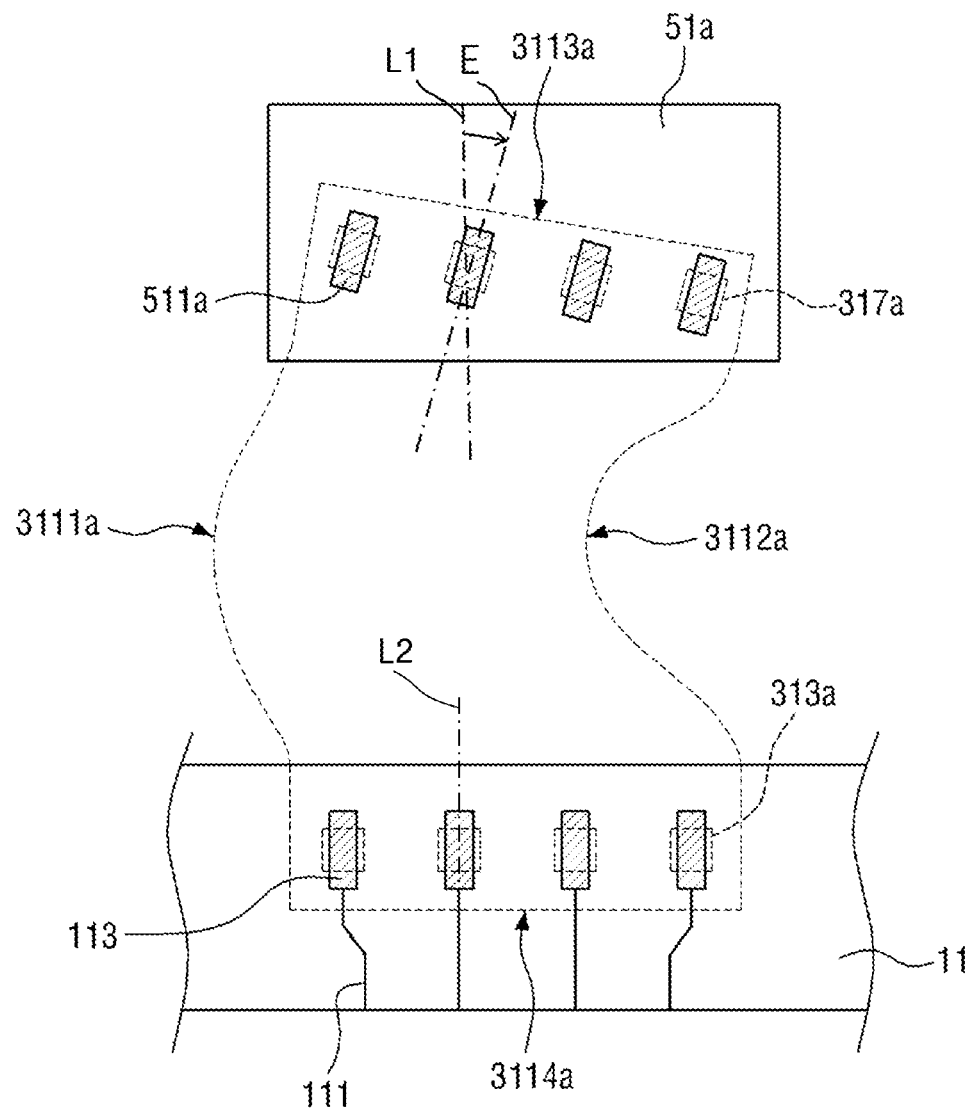
FIG. 5 is a schematic view of part of the curved display device of FIG. 4.

FIG. 5 is a schematic view of part of the curved display device of FIG. 4, and particularly, part of the curved display device where the first flexible wiring board 31a, the curved display panel 10 and the first PCB 51a are connected to one another.

Referring to FIGS. 1, 4 and 5, a plurality of panel connection pads 113, which are connected to the first input pads 313a, respectively, of the first flexible wiring board 31a, may be formed on the curved display panel 10. The panel connection pads 113 may be connected to a plurality of data lines 111, respectively, and may be disposed along a side (or in the peripheral region) of the first substrate 11.

The lengthwise direction of the panel connection pads 113 may be parallel to a straight line L2 that is perpendicular to the long sides of the curved display panel 10 or the first substrate 11. That is, the panel connection pads 113 may be substantially perpendicular to the long sides of the curved display panel 10 or the first substrate 11.

A plurality of substrate connection pads 511a, which are connected to the output pads 317a, respectively, of the first flexible wiring board 31a, may be formed on the first PCB 51a. The substrate connection pads 511a may be connected to circuits or elements mounted on the first PCB 51a, and may provide signals generated or processed by the circuits or the elements to the first flexible wiring board 31a.

When the first PCB 51a is not bent to mount the first PCB 51a on the rear side of the first substrate 11, a lengthwise direction E of the substrate connection pads 511a may be tilted to a direction from a straight line L1 that is perpendicular to the long sides of the first PCB 51a. That is, the lengthwise direction E of the substrate connection pads 511a may form an acute angle with the straight line L1. The lengthwise direction E of the substrate connection pads 511a may be tilted toward one of the first side 3111a and the second side 3112a whichever has a smaller curvature radius. As already mentioned above with reference to FIG. 4, in an exemplary embodiment, the curvature radius of the second side 3112a of the third portion 31a-3 may be smaller than the curvature radius of the first side 3111a of the third portion 31a-3. In this exemplary embodiment, the lengthwise direction E of the substrate connection pads 511a may be tilted from the straight line L1 toward the second side 3112a of the third portion 31a-3 (i.e., to the right). By forming the substrate connection pads 511a to have an inclination with respect to the long sides of the first PCB 51a, the output pads 317a and the substrate connection pads 511a may be easily connected to each other even if the first flexible wiring board 31a is twisted to be attached onto the first PCB 51a.

Even though not illustrated in FIG. 5, the input pads of the second flexible wiring board 32a may also be connected to a plurality of panel connection pads 113, respectively. More specifically, the second PCB 52a to which the second flexible wiring board 32a is connected may be provided with a plurality of substrate connection pads, and the substrate connection pads of the second PCB 52a may have the same structure as, or a similar structure to, the substrate connection pads 511a of the first PCB 51a.

Figure 6:
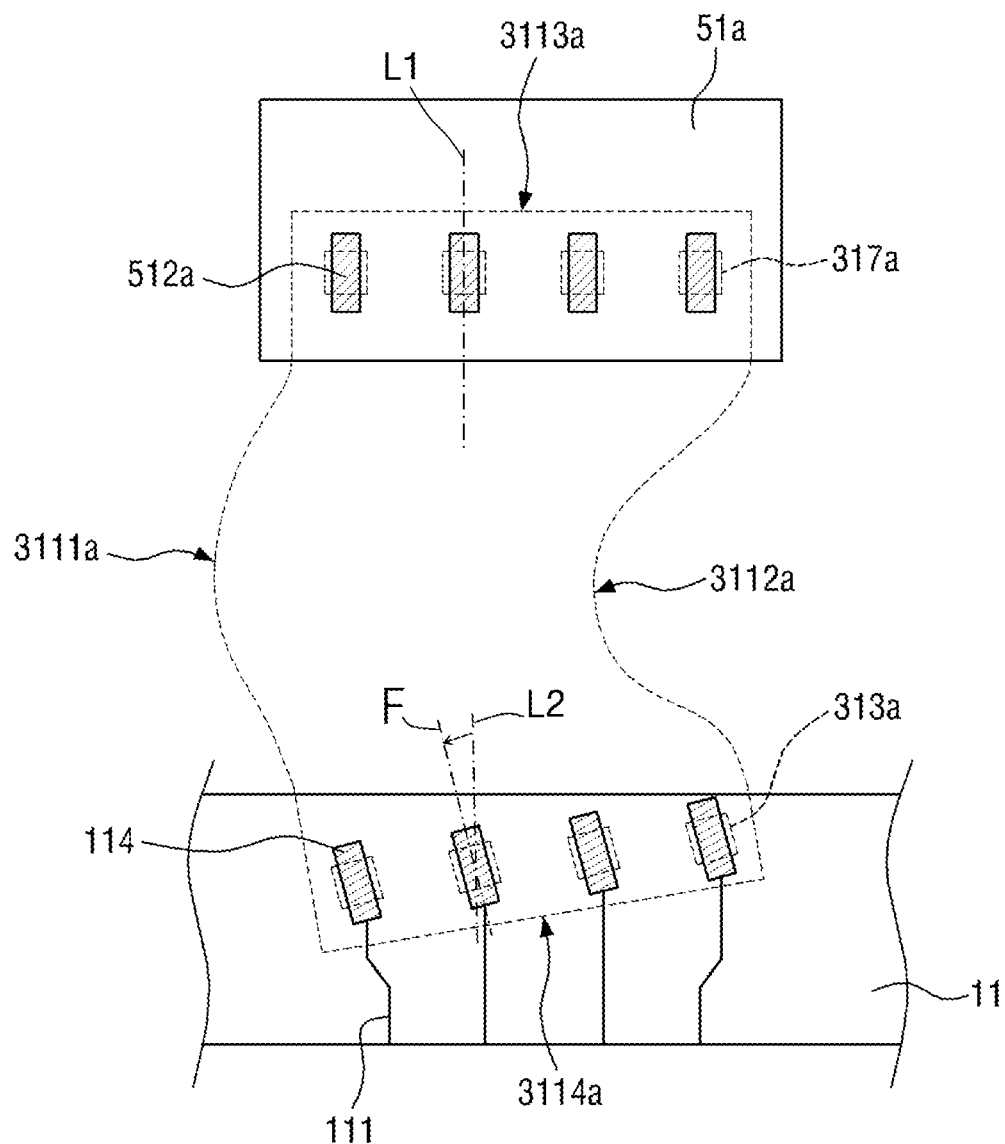
FIG. 6 is a schematic view of a modified example of the curved display device of FIG. 5.
Figure 6:
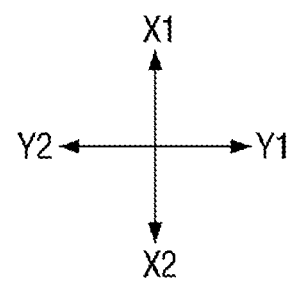

FIG. 6 is a schematic view of a modified example of the curved display device of FIG. 5. The curved display device of the exemplary embodiment of FIG. 6 is the same as the curved display device of the exemplary embodiment of FIG. 5 except for a plurality of panel connection pads 114 and a plurality of substrate connection pads 512a, and thus will hereinafter be described, focusing mainly on the panel connection pads 114 and the substrate connection pads 512a.

Referring to FIG. 6, when the first PCB 51a is not bent to mount the first PCB 51a on the rear side of the first substrate 11, a lengthwise direction F of the panel connection pads 114 may be tilted to one direction from a straight line L2 that is perpendicular to the long sides of the curved display panel 10 or the first substrate 11. That is, the lengthwise direction F of the panel connection pads 114 may form an acute angle with the straight line L2. The lengthwise direction F of the panel connection pads 114 may be tilted toward one of the first side 3111a and the second side 3112a whichever has a greater curvature radius. As already mentioned above with reference to FIG. 4, in an exemplary embodiment, the curvature radius of the second side 3112a of the third portion 31a-3 may be greater than the curvature radius of the first side 3111a of the third portion 31a-3. In this exemplary embodiment, the lengthwise direction F of the panel connection pads 114 may be tilted toward the first side 3111a of the third portion 31a-3 with respect to the straight line L2 (i.e., the left). By forming the panel connection pads 114 to have an inclination with respect to the long sides of the first substrate 11, the panel connection pads 114 and a plurality of input pads 313a may be easily connected to each other even if the first flexible wiring board 31a is twisted to be attached onto the curved display panel 10 or the first substrate 11.

Figure 7:
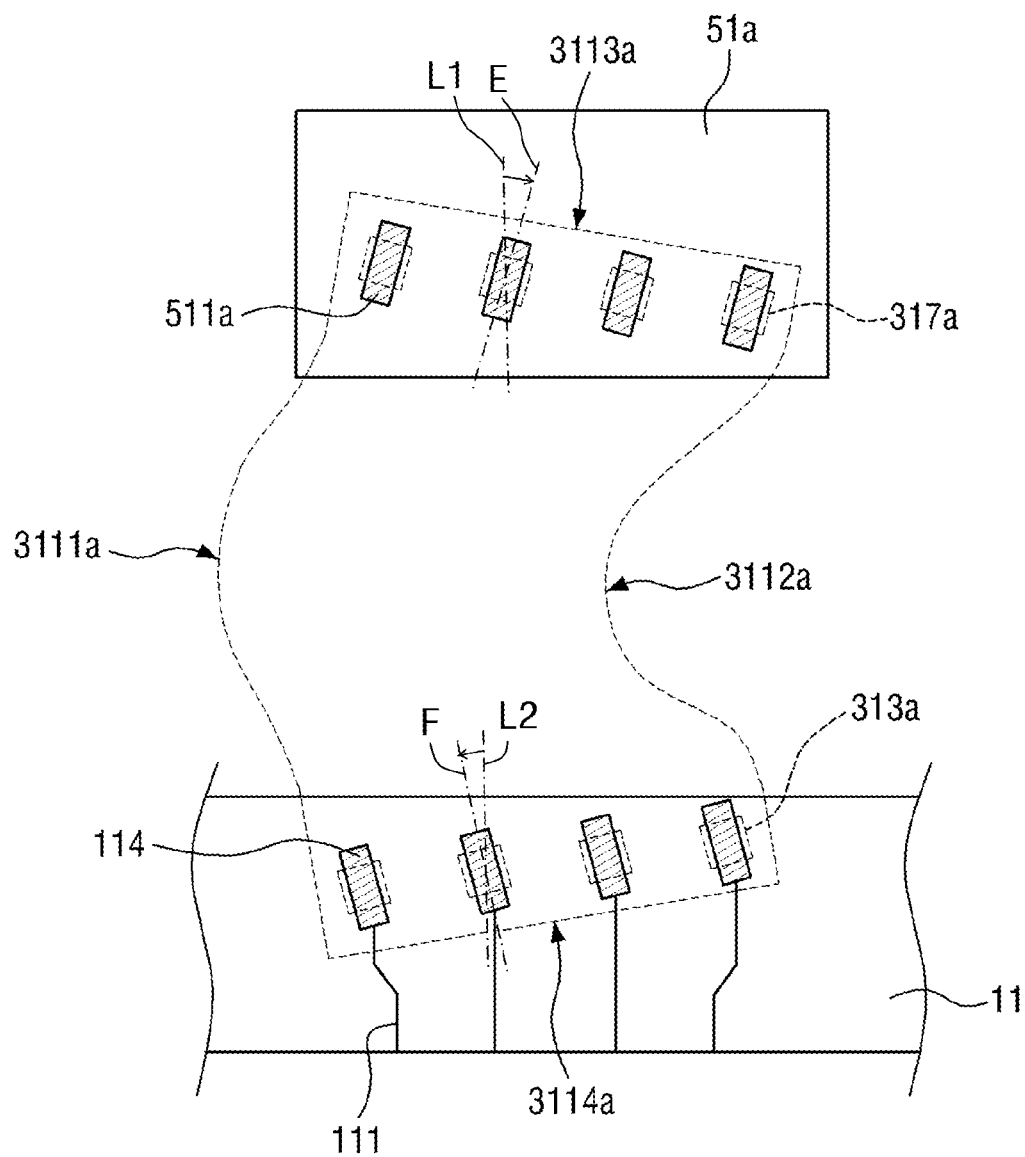
FIG. 7 is a schematic view of another modified example of the curved display device of FIG. 5.
Figure 7:
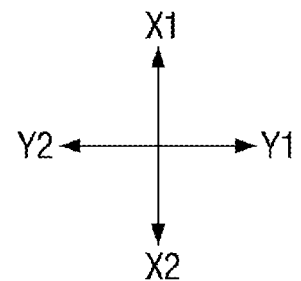

FIG. 7 is a schematic view of another modified example of the curved display device of FIG. 5. The curved display device of the exemplary embodiment of FIG. 6 is the same as the curved display device of the exemplary embodiment of FIG. 5 except for a plurality of panel connection pads 114, and thus will hereinafter be described, focusing mainly on the panel connection pads 114.

Referring to FIG. 7, when the first PCB 51a is not mounted on the rear side of the first substrate 11, a lengthwise direction F of the panel connection pads 114 may be tilted to one direction from a straight line L2 that is perpendicular to the long sides of the curved display panel 10 or the first substrate 11. That is, the lengthwise direction F of the panel connection pads 114 may form an acute angle with the straight line L2. The lengthwise direction F of the panel connection pads 114 may be tilted toward one of the first side 3111a and the second side 3112a whichever has a greater curvature radius.

When the first PCB 51a is not mounted on the rear side of the first substrate 11, a lengthwise direction E of a plurality of substrate connection pads 511a may be tilted to one direction from a straight line L1 that is perpendicular to the long sides of the first PCB 51a. As already mentioned above with reference to FIG. 5, the lengthwise direction E of the substrate connection pads 511a may be tilted toward one of the first side 3111a and the second side 3112a whichever has a smaller curvature radius.

In an exemplary embodiment, the curvature radius of the first side 3111a of the third portion 31a-3 may be greater than the curvature radius of the second side 3112a of the third portion 31a-3.

In this exemplary embodiment, the lengthwise direction F of the panel connection pads 114 may be tilted from to the straight line L2 toward the first side 3111a of the third portion 31a-3 (i.e., to the left), and the lengthwise direction E of the substrate connection pads 511a may be tilted from the straight line L1 toward the second side 3112a of the third portion 31a-3 (i.e., to the right). By forming both the panel connection pads 113 and the substrate connection pads 511a at an inclination with respect to the sides of the first PCB 51a and the sides of the first substrate 11, respectively, not only the panel connection pads 114 and the input pads 313a, but also the substrate connection pads 511a and the output pads 317a may be easily connected to each other even if the first flexible wiring board 31a is twisted to be attached onto the curved display panel 10 and the first PCB 51a.

While the inventive concept has been particularly shown and described with reference to exemplary embodiments thereof, it will be understood by those of ordinary skill in the art that various changes may be made therein without departing from the spirit and scope of the inventive concept as defined by the following claims. The exemplary embodiments should be considered in a descriptive sense only and not for purposes of limiting the scope of the inventive concept.

What is claimed is:

1. A curved display device, comprising:
a curved display panel configured to have short sides and long sides with curvature, the curved display panel including a first area, which includes a central line dividing the long sides of the curved display panel in half and has a first curvature radius, and a second area which has a second curvature radius that is greater than the first curvature radius;
a first flexible wiring board configured to be connected to the first area of the curved display panel;
a second flexible wiring board configured to be connected to the second area of the curved display panel;
a first PCB configured to be connected to the first flexible wiring board and provide signals for driving the curved display panel; and
a second PCB configured to be connected to the second flexible wiring board and provide signals for driving the curved display panel,
wherein the first flexible wiring board includes a first portion, which is connected to the first area, a second portion, which is connected to the first PCB, and a third portion, which is disposed between the first portion and the second portion and has curved sides, and the second flexible wiring board includes a fourth portion, which is connected to the second area, a fifth portion, which is connected to the second PCB, and a sixth portion, which is disposed between the fourth portion and the fifth portion and has curved sides,
wherein bellies of the curved sides in the first flexible wiring board and bellies of the curved sides in the second flexible wiring board face a same direction.

2. The curved display device of claim 1, wherein a first side of the third portion is closer than a second side of the third portion to the central line, a first side of the sixth portion is closer than a second side of the sixth portion to the central line, and the first side of the third portion is closer than the first side of the sixth portion to the central line.

3. The curved display device of claim 2, wherein a curvature radius of the first side of the third portion differs from a curvature radius of the second side of the third portion and a curvature radius of the first side of the sixth portion differs from a curvature radius of the second side of the sixth portion.

4. The curved display device of claim 3, wherein the curvature radius of the first side of the third portion is greater than the curvature radius of the second side of the third portion.

5. The curved display device of claim 3, wherein a curvature radius of the first side of the third portion differs from a curvature radius of the first side of the sixth portion.

6. The curved display device of claim 5, wherein the curvature radius of the first side of the third portion is greater than the curvature radius of the first side of the sixth portion.

7. The curved display device of claim 3, wherein a curvature radius of the first side of the sixth portion is greater than a curvature radius of the second side of the sixth portion.

8. The curved display device of claim 3, wherein a curvature radius of the second side of the third portion differs from a curvature radius of the second side of the sixth portion.

9. The curved display device of claim 8, wherein the curvature radius of the second side of the third portion is greater than the curvature radius of the second side of the sixth portion.

10. The curved display device of claim 2, wherein a length of the first side of the third portion differs from a length of the second side of the third portion, a length of the first side of the sixth portion differs from a length of the second side of the sixth portion, and the length of the first side of the third portion differs from the length of the first side of the sixth portion.

11. The curved display device of claim 1, wherein the first PCB includes one or more first substrate connection pads, which are connected to the second portion, the second PCB includes one or more second substrate connection pads, which are connected to the fifth portion, a lengthwise direction of the first substrate connection pads or the second substrate connection pads is tilted to one direction from the central line.

12. The curved display device of claim 1, wherein the curved display panel includes one or more first panel connection pads, which are connected to the first portion, and one or more second panel connection pads, which are connected to the fourth portion, and a lengthwise direction of the first panel connection pads or the second panel connection pads is tilted to one direction from the central line.

* * * * *